United States Patent [19]

Tatsumi

[11] Patent Number: 5,200,028
[45] Date of Patent: Apr. 6, 1993

[54] ETCHING PROCESS OF SILICON MATERIAL

[75] Inventor: Tetsuya Tatsumi, Kanagawa, Japan
[73] Assignee: Sony Corporation, Tokyo, Japan
[21] Appl. No.: 741,735
[22] Filed: Aug. 7, 1991
[30] Foreign Application Priority Data
Aug. 8, 1990 [JP] Japan ................... 2-211388
[51] Int. Cl.⁵ .......................................... H01L 21/00
[52] U.S. Cl. ...................................... 156/656; 156/643;
156/646; 156/657; 437/193; 437/200
[58] Field of Search .............. 156/643, 646, 656, 657,
156/653; 437/193, 200

[56] References Cited

U.S. PATENT DOCUMENTS

| | | | |
|---|---|---|---|
| 4,490,209 | 12/1984 | Hartman | 156/643 |
| 4,778,563 | 10/1988 | Stone | 156/662 |
| 4,799,991 | 1/1989 | Dockrey | 156/643 |
| 4,919,749 | 4/1990 | Mauger et al. | 156/643 |
| 5,007,982 | 4/1991 | Tsou | 156/643 |
| 5,013,398 | 5/1991 | Long et al. | 156/651 |

FOREIGN PATENT DOCUMENTS 272143 6/1988 European Pat. Off. .

*Primary Examiner*—Brian E. Hearn
*Assistant Examiner*—George Goudreau
*Attorney, Agent, or Firm*—Hill, Steadman & Simpson

[57] ABSTRACT

A process is disclosed for etching a silicon-based structure comprised of a silicon layer and a high-melting silicide layer. Good shaping results from etching of the two layers with use of two gaseous mixtures having their respective different ratios of a hydrogen bromide gas and a fluorine radical-donating gas. Separate etching is possible of the silicon layer with a hydrogen bromide gas and of the silicide layer with a gaseous mixture of the above type. A silicon-containing layer is also etched with a hydrogen gas alone with the end point of etching being precisely detected.

3 Claims, 4 Drawing Sheets

ETCHING PROCESS OF SILICON MATERIAL

BACKGROUND OF THE INVENTION

1. Field of the Invention

The present invention relates to a process for etching silicon-based materials mainly of a character having disposed on a substrate either one or both of a silicon layer and a silicon-containing layer. Such process is suitable particularly for use in etching so-called polycide structures in the manufacture of semiconductors.

2. Description of the Related Art

As is generally know in the art of electronic components such as semiconductors and the like, those materials comprised of a substrate and at least one silicon layer laminated thereon can be etched for patterning. One typical material has superposed on a substrate a silicon layer and a high-melting silicide layer, finding its use for gate wirings on semiconductors.

High-melting silicides are advantageous as they are smaller in sheet resistance than polycrystalline silicons commonly acceptable as gate wiring materials for conventional circuits of a large-scale integration type (LSI). Further, the silicide when superposed on a silicon layer or a polysilicon layer in particular has been formed to retain the resultant interface at a highly reliable level. This reliability is seen at an interface defined by such a silicon layer together with silicon dioxide ($SiO_2$) as a gate-insulating film.

The above silicon-silicide composite material is usually named a polycide structure from lamination of a silicide on a polysilicon.

As a result of the advent of high-speed LSI circuits, polycide structures have recently become prominent for gate formation. This entails various modes of etching.

To attain desired patterning, a given polycide structure is required to be etched with its two different layers held in anisotropic relation to each other. A family of gases know as chlorofluorocarbons (CFC) has been used among which is typified 1,1,2-trichloro-1,2,2-trifluoroethane ($C_2Cl_3F_3$) (CFC113). These gases, however, are reported to rise into the stratosphere and to erode the ozone layer, posing serious environmental problems. Warnings are being made to phase out the use of such ozone-depleting chemicals.

Great concern has been directed toward the prevision of a substitute gas which is highly capable of exerting an anisotropic action on both silicon and high-melting silicide layers, thus ensuring etching in good shape. Hydrogen bromide (HBr) attracts much attention, for its inherent ability to etch with high anisotropy and high selectivity, as a replacement for the CFC gases. One problem with HBr is that no method is established for detecting the end point of etching in the case where the gas is used alone. This means that HBr does not warrant commercial acceptance in etching silicon-based materials for gate formation.

The present inventors have previously found that polycide structures can be etched into the form of films at increased rates of production and with improved magnitudes of anisotropy and selectivity as disclosed in Japanese Patent Application No. 2-10489. This mode of etching is designated to use a mixture of an HBr gas with a fluorine radical-donating gas such as sulfur hexafluoride ($SF_6$). The HBr-$SF_6$ gas is undesirable for etching a silicon layer such as of a doped polysilicon (DOPOS) under the same etch conditions as in a high-melting silicide layer such as of a tungsten silicide ($WSi_x$). The silicon layer is necessarily susceptible to objectionable side etching.

SUMMARY OF THE INVENTION

With the foregoing drawbacks in view, it is an object of the present invention to provide a new etching process of a structure having a silicon layer and a high-melting silicide layer which will produce desired etching with use of two different HBr-containing gases, or of an HBr gas and an HBr-containing gas and with immunity from any side etched silicon layer. The process of the invention further enables etching of a silicon-containing layer using an HBr gas alone while detecting the end point of etching with utmost ease and high precision.

In one aspect the present invention provides a process for subjecting a silicon-based structure to etching, the structure having a silicon layer and a high-melting silicide layer superposed one on the other over a substrate, which process comprises etching the silicon layer with a first gaseous medium, and etching the silicide layer with a second gaseous medium, each of the first and second gaseous media having a hydrogen bromide gas and a fluorine radical-donating gas contained in a selected ratio, the first and second gaseous media differing in each selected ratios from each other.

In another aspect this invention provides a process for subjecting a silicon-based structure to etching, the structure having a silicon layer and a high-melting silicide layer superposed one on the other over a substrate, which process comprises etching the silicon layer with a hydrogen bromide gas, and etching the silicide layer with a gaseous mixture containing a hydrogen bromide gas an a fluorine radical-donating gas.

In a further aspect the invention provides a process for subjecting a silicon-based structure to etching, the structure having a layer containing a silicon material disposed over a substrate, which process comprises etching the silicon-containing layer with a hydrogen bromide gas while detecting the end point of etching by monitoring the change in emission spectral intensities, the spectral intensities resulting from reaction of the silicon material with the gas.

The above and other objects, features and advantages of the present invention will become more apparent from the following description when making reference to the detailed description and the accompanying sheets of drawings.

DETAILED DESCRIPTION OF THE INVENTION

Figure 1A:
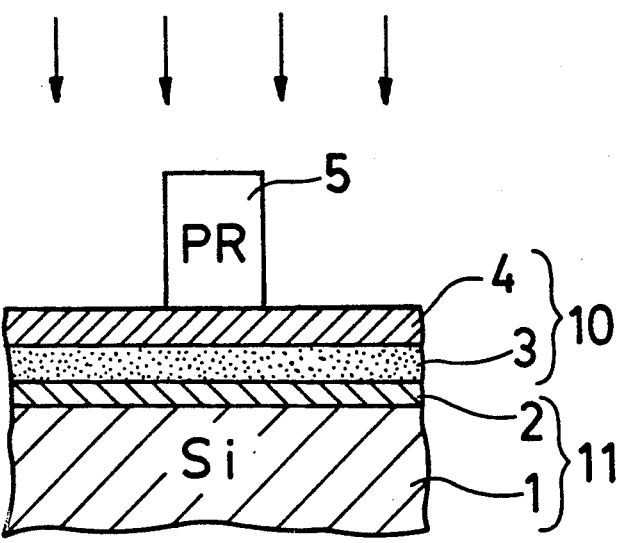
FIGS. 1(a) and 1(b) are diagrammatical crosssectional views of a silicon-based structure, before and after etching, embodying the present invention and illustrated in Example 1.

In a first embodiment of the process according to the present invention, a selected silicon-based structure is allowed to etch by the use of specified gaseous media.

Suitable silicon-based structures used herein are those made up of a silicon layer and a high-melting silicide layer laminated on a substrate. The silicon layer denotes a layer predominantly of a silicon element. This element may be of a mono- or poly-crystalline nature and may be in a form having alloys incorporated, which alloys contain metals other than silicon (Si), nonmetals or other impurities. Where the silicon layer is used in a polycide structure, DOPOS is preferred which is obtained by doping a polysilicon with an impurity such as phosphor (P), boron (B) or the like.

By the term high-melting silicide layer is meant a layer is which is contained in a larger proportion a metal of a high melting point such as tungsten (W), titanium (Ti), Molybdenum (Mo) or the like.

Gaseous media eligible in the invention are mixtures of an HBr gas with a gas capable of donating a fluorine radical (F*). This latter gas includes fluorine-containing gases such as sulfur hexafluoride ($SF_6$), nitrogen trifluoride ($NF_3$), chlorine trifluoride ($ClF_3$), fluorine ($F_2$), hydrogen fluoride (HF) and the like, all such gases participating in reactive actions during etching.

Importantly, the silicon and silicide layers should be etched independently by the use of two different gaseous media. These media are made similar in the composition as specified above but should be varied in the ratio of HBr to F* donor. Such ratios may suitably be determined with the nature and material of layers to be etched.

Owing to the chemical actions of the gaseous mixtures of varying HBr gas to F* donor ratios, each of the silicon and silicide layers can be etched at a desirably optimum level so that a good etched product is formed. The silicon layer in particular is free from side etching as against the prior mode of etching.

A second embodiment of the invention contemplates etching a given silicon layer with an HBr gas and a given high-melting silicide layer with a gaseous mixture containing an HBr gas and an F* donor gas. Etching is achieved with good results as is in the first embodiment.

According to a third embodiment of the invention, a selected silicon-based structure is subjected to etching with an HBr gas alone. The structure has a silicon-containing layer laminated on a substrate. The silicon-containing layer in this embodiment has a larger proportion of a silicon element and generates a material such as silicon bromide or the like upon reaction with HBr, which material emits a specific spectral wavelength at a determinable intensity.

An advantage of the third embodiment is that the etch end point of the silicon-containing layer can be detected with great precision while in monitoring of the change in emission spectral intensities. The emission spectrum shows peculiar behavior at near the end point of etching and at a wavelength of 400 to 500 nm. Though exactly unknown, such behavior will be probably due to the action of a silicon bromide ($SiBr_x$) or a silicon hydride bromide (SiHBr) which is derivable by reaction of Si with HBr during etching. Precise determination of the etch end point results in an etched product of good qualities.

With further reference to the first and second embodiments, exact reasoning is not known for their beneficial effects achieved. The F* donor gas will presumably act as an etchant with respect to a silicon or silicide layer, while the HBr gas will serve as a depositor to form deposits on a side wall of the layer. The gaseous mixtures according to the invention, therefore, are believed to be made optimal, at certain different ratios of an HBr gas and an F* donor, in etching either one or both of the silicon and silicide layers. The behavior of an $SF_6$-HBr gas on polycide structures is taught in "Semiconductor World", No. 7, Pages 80 to 84, 1990, Press Journal Publishers.

The invention will now be described by way of the following examples which should be construed as illustrative rather than restrictive.

EXAMPLE 1

The first embodiment of the invention was applied in patterning a semiconductor in which a silicon-based structure was etched with use of photoresist as shown in FIG. 1(a).

The etch structure used was comprised of a substrate 11 and an etch portion 10 disposed thereover. The substrate 11 had laminated on a silicon plate 1 an $SiO_2$ layer 2 as a gate-insulating film, whereas the etch portion 10 had a silicon layer 3 and a high-melting silicide layer 4 superimposed in that order. P-doped DOPOS was optionally chosen as the silicon layer 3, but DOPOS doped with B or other impurities may of course be used with the desired degree of electrical conductivity. The silicide layer 4 was $WSi_x$ in composition.

Figure 2:
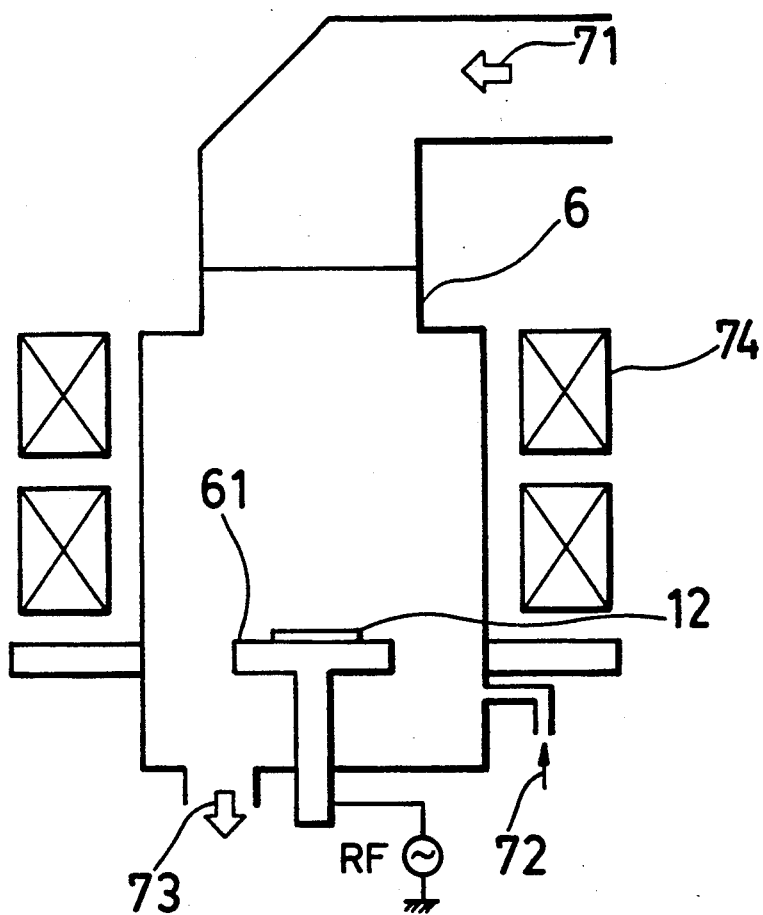
FIG. 2 is a diagrammatical vertical view of an etching system used in Examples 1 to 3.

A microwave etching apparatus of an electron cyclotron resonance or ECR type as seen in FIG. 2 was employed to conduct etch testing. The apparatus was constructed with an etching chamber 6 in which a T-shaped stand 61 was disposed to mount thereon an etch structure 12, namely a semiconductor wafer in this example. Designated at 71 was a microwave ray, at 72 an etching gas, at 73 an exhaust port and at 74 two opposite pairs of solenoid coils located to develop magnetic fields.

To avoid objectionable side edge or under cut on the silicon or DOPOS layer 3, this example was contrived such that the layer 3 was etched with the use of an $SF_6$-HBr gas but at a lower flow rate of $SF_6$ than the case with the silicide or $WSi_x$ layer 4.

The $WSi_x$ layer was firstly subjected to anisotropic etching under the conditions given below.

etching gas: $SF_6$/HBr=15/35 SCCM
microwave: 250 mA
radio frequency or RF electric power: 150 W
gas pressure: 5m Torr It has now been found that, by monitoring the resultant emission spectrum particularly at a 505 nm wavelength, etching can suitably be brought to an end at a $WSi_x$/DOPOS interface. Precise detection of the etch end point at a spectral wavelength of 500 to 600 nm is disclosed by present inventors in Japanese Patent Application No. 2-47074.

Figure 1B:
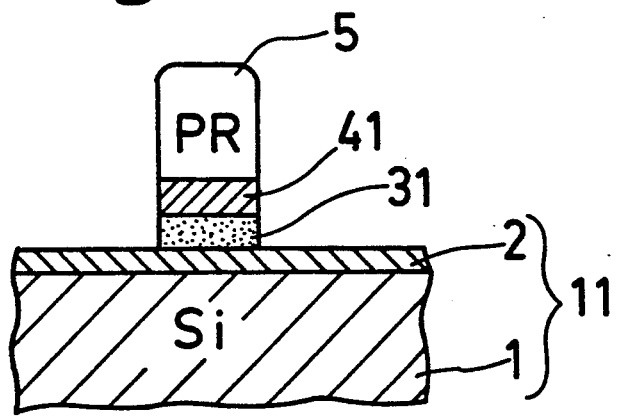

Upon completion of etching of the $WSi_x$ layer, the DOPOS layer was etched under the following conditions.

etching gas: $SF_6$/HBr=3/47 SCCM
microwave: 250 mA
RF electric power: 50 W
gas pressure: 5m Torr Etching of the DOPOS layer was effected at a lower flow rate of $SF_6$ and also at a lower electric power of RF. An acceptably etched product was thus obtained as shown in FIG. 1(b) and with DOPOS inhibited from side etching. As appears clear from the test results, decreased flow of $SF_6$ and hence decreased donation of F* have proved to cooperate with HBr in protecting the DOPOS layer on the side wall, contributing to improved resistance to side etching. In addition to a low flow of $SF_6$, a small bias of RF has been found effective in attaining a high degree of etch selectivity.

Both the DOPOS layer 3 and the $WSi_x$ layer 4 were anisotropically etched, without side etch, into good silicon and silicide patterns 31, 41 as illustrated in FIG. 1(b).

Although the silicon layer has been shown etched with an $SF_6$-HBr gas of a low ratio of $SF_6$, a fluorine radical-free HBr gas may be used alone as later mentioned in Example 2. In the case of the etching conditions noted in this example, a gaseous mixture of an HBr gas and an F* donor is preferred to increase the speed of etching.

In this example, the silicon or DOPOS layer and the silicide or $WSi_x$ layer are etched by the use of two gases of $SF_6$ to HBr ratios varied. In etching the silicon layer, such a gas of a lower ratio of $SF_6$ should importantly be used to ensure freedom from side etch. Also importantly, smaller biases of RF should be selected than are with the silicide layer so that etching is done with high selectivity. Strict observance of these requirements provides adequate etching of both silicon and silicide layers.

The fluorine radical-donating gases listed above are made likewise feasible in place of $SF_6$.

EXAMPLE 2

Performance evaluation was made of the second and third embodiments of the invention.

The third embodiment is generally applicable to detection of the etch and points as regards silicon-containing layers which are not specifically restrictive but capable of forming $SiBr_x$ or $SiHBr_x$. Silicon elements used in the third embodiment may be selected, as above stated, from impurity-containing silicons, silicon-containing alloys and silicide-containing silicons. Laminated is the silicon-containing layer over an $SiO_2$ base, a silicon nitride or SiN base, or a silicon-based layer placed on a silicon-free base.

In the second embodiment, etching was performed with respect to a silicon-based gate structure. A silicon or DOPOS layer 3 interposed between a gate insulator or $SiO_2$ film 2 and a silicide or $WSi_x$ layer 4 was etched with an HBr gas while the end point of etching was being detected as in the third embodiment.

An ECR plasma etcher was used as in Example 1. The silicide layer was firstly etched with an $SF_6$-HBr gas and under the same conditions as in Example 1.
  etching gas: $SF_6$/HBr=15/35 SCCM
  microwave: 250 mA
  RF electric power: 150 W
  gas pressure: 5m Torr The procedure of Example 1 was followed in determining the etch end point of the silicide layer. Subsequently, the silicon layer was etched under a set of conditions given below.
  etching gas: HBr=50 SCCM
  microwave electric power: 850 W
  RF bias: 150 W
  gas pressure: 5m Torr During etching of the silicon layer, an emission spectrum at 440 nm was monitored to detect the etch end point. The resultant spectral intensity sharply decreased at an interface between DOPOS and $SiO_2$, thus rendering the end point fully precisely determinable.

The process of the second embodiment permits completion of etching of the DOPOS layer without any adverse effect on the $SiO_2$ base. This mode of detecting the etch end point departs from the differences in spectral intensities which may take place on etching of a silicon material and of other metallic materials.

Figure 3:
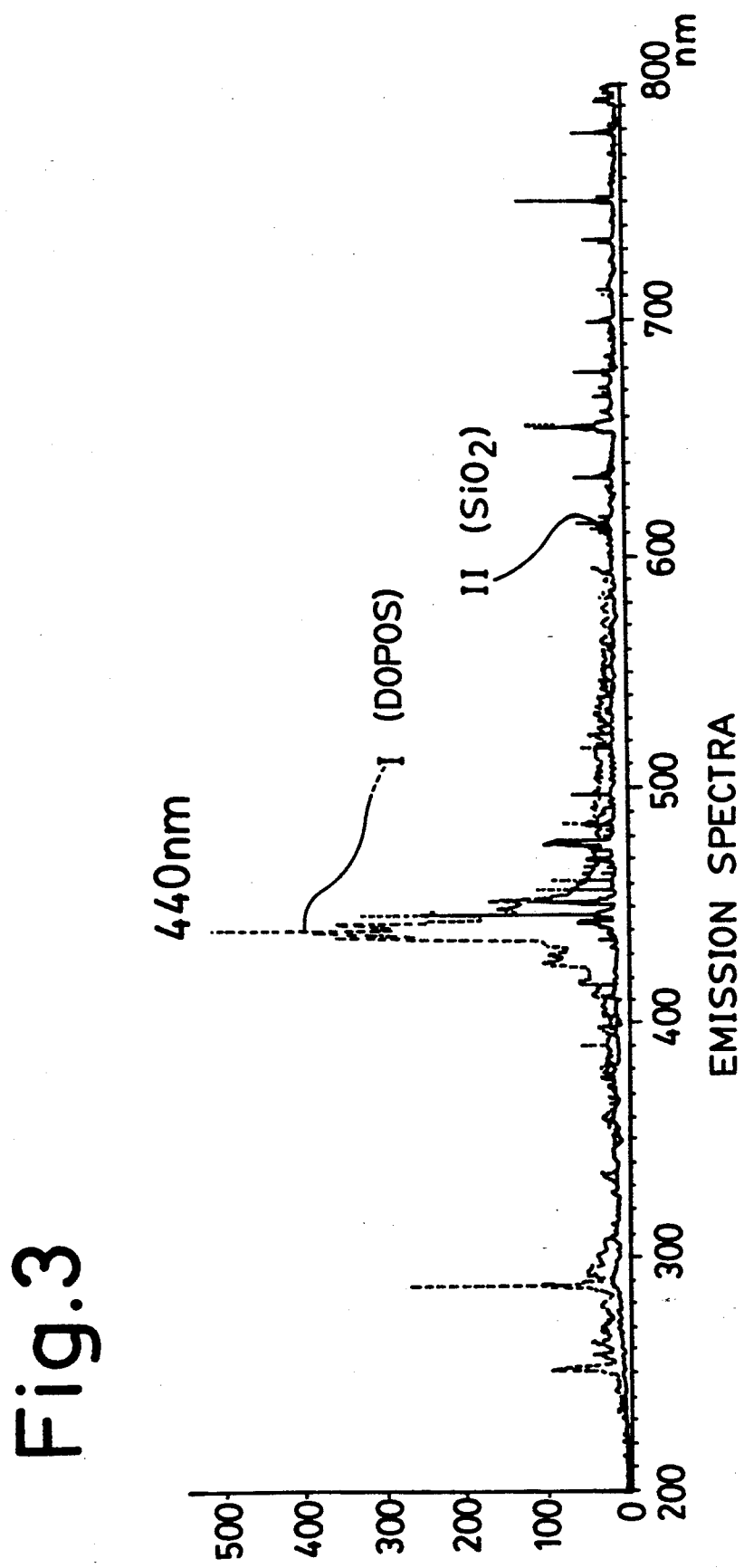
FIGS. 3 and 4 are emission spectral representations taken to explain the end points of etching shown in Examples 2 and 3 FIG. 3 being directed to the emission spectral of each of DOPOS and $SiO_2$ etched and FIG. 4 to the spectral difference between DOPOS and $SiO_2$.
Figure 4:
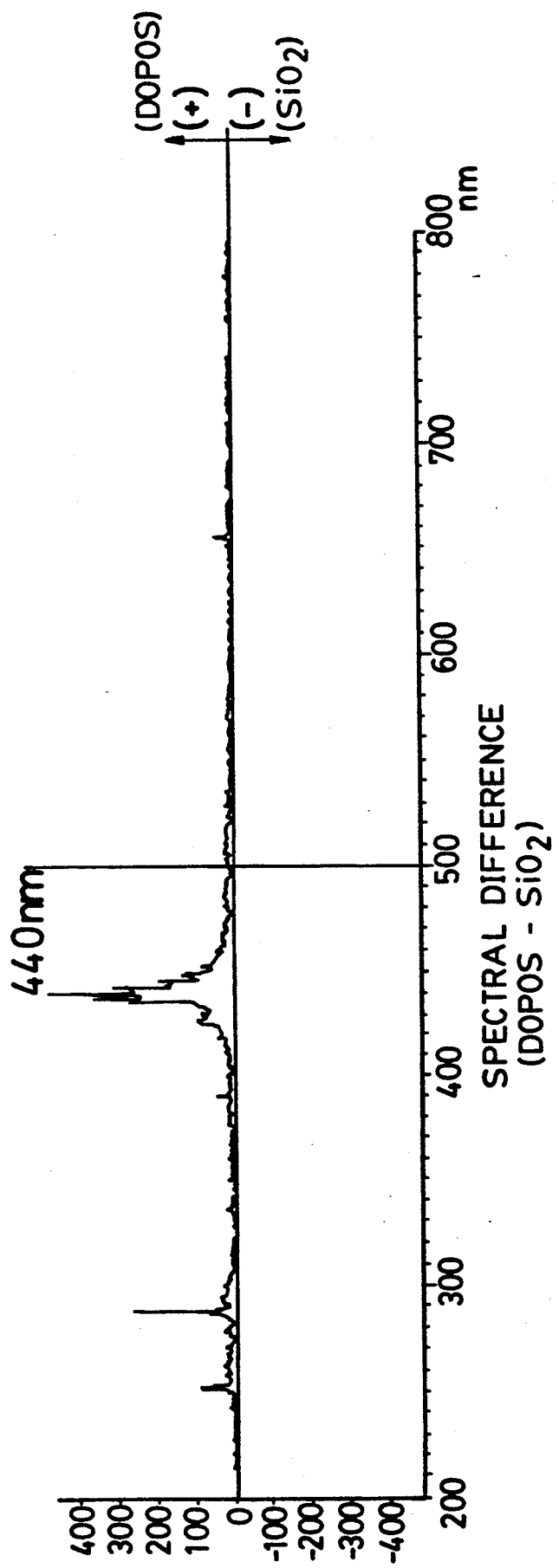

FIGS. 3 and 4 are taken to further explain the detection of etch end points contemplated under the invention.

In FIG. 3, there are illustrated an emission spectrum I of the DOPOS layer etched as shown in dotted lines and a similar spectrum II of the $SiO_2$ layer etched as shown in solid lines, both spectra being superposed to facilitate comparison. The two layers represent their highly different spectra depending upon the wavelengths.

FIG. 4 shows the spectral difference between DOPOS and $SiO_2$ which comes from deduction of the $SiO_2$ spectrum from the DOPOS spectrum DOPOS shows an intense emission at above the lateral axis and $SiO_2$ at below that axis.

As is evidenced by FIGS. 3 and 4, DOPOS has been proved to show an intense emission at a wavelength of 400 to 500 nm, particularly at 440 nm targeted in this example, as contrasted to $SiO_2$. The spectral intensity of DOPOS at near 440 nm is believed attributable to the action of an Si-HBr reaction product such as $SiBr_x$ or SiHBr. Thus, polysilicons other than DOPOS now in the example and other metallic silicides will behave in like manner upon etching with HBr. This means that the process of the third embodiment applies as such to the detection of the end points of those silicons and silicides while in etching.

The second embodiment contributes greatly to detection of the etch end points of silicon layers in polycide structures and other silicon-containing layers with resort to the varying emission intensities particularly at near 440 nm.

EXAMPLE 3

The third embodiment of the invention was applied to a polycide structure shown in FIG. 1(a). Checking was made of the end point of etching.

A silicon or DOPOS layer 3 and a silicide or $WSi_x$ layer were etched with HBr alone on the same etcher as used in Example 1 and under the conditions indicated below.
  etching gas: HBr=50 SCCM
  microwave electric power: 850 W
  RF bias: 150 W
  gas pressure: 5m Torr The etch end point was detected by monitoring an emission spectrum at 440 nm. At that wavelength the spectral intensity showed a sharp decline at near a DOPOS-$SiO_2$ interface. Precise detection was possible of the end point of etching.

What is claimed is;

1. A process for subjecting a silicon-based structure to etching, said structure having a silicon layer and a high-melting silicide layer superposed one on the other over a substrate, which process comprises etching said silicon layer with a first gaseous medium, and etching said silicide layer with a second gaseous medium, each of said first and second gaseous media having a hydrogen bromide gas and a fluorine radical-donating gas contained in a selected ratio, said first and second gaseous media differing in each selected ratios from each other.

2. A process according to claim 1, wherein said silicide layer comprises a tungsten, titanium or molybdenum metal.

3. A process for subjecting a silicon-based structure to etching, said structure having a silicon layer and a high-melting silicide layer superposed one on the other over a substrate, which process comprises etching said silicon layer with a first gaseous medium, and etching said silicide layer with a second gaseous medium, each of said first and second gaseous media having a hydrogen bromide gas and a fluorine radical-donating gas contained in a selected ratio, said first and second gaseous media differing in each selected ratios from each other, and wherein said fluorine radical-donating gas is a sulfur hexafluoride, nitrogen trifluoride, chlorine trifluoride, fluorine or hydrogen fluoride gas.

* * * * *